United States Patent
Sitaraman et al.

(10) Patent No.: US 7,011,530 B2
(45) Date of Patent: Mar. 14, 2006

(54) MULTI-AXIS COMPLIANCE SPRING

(76) Inventors: Suresh K. Sitaraman, 1951 Grace Arbor Ct., Atlanta, GA (US) 30329; Lunyu Ma, Apt. 701, 300 Home Park Ave., Atlanta, GA (US) 30318; Qi Zhu, Apt. 701, 300 Home Park Ave., Atlanta, GA (US) 30318

(*) Notice: Subject to any disclaimer, the term of this patent is extended or adjusted under 35 U.S.C. 154(b) by 0 days.

(21) Appl. No.: 10/443,957

(22) Filed: May 23, 2003

(65) Prior Publication Data

US 2004/0022040 A1 Feb. 5, 2004

Related U.S. Application Data

(60) Provisional application No. 60/382,602, filed on May 24, 2002.

(51) Int. Cl.
*H01R 12/00* (2006.01)

(52) U.S. Cl. ...................................................... 439/66
(58) Field of Classification Search ................. 439/66, 439/67, 68, 71; 361/772; 174/260, 259
See application file for complete search history.

(56) References Cited

U.S. PATENT DOCUMENTS

| | | | |
|---|---|---|---|
| 3,842,189 A | | 10/1974 | Southgate |
| 5,090,118 A | * | 2/1992 | Kwon et al. .................. 29/843 |
| 5,121,298 A | * | 6/1992 | Sarma et al. ................ 361/774 |
| 5,152,695 A | * | 10/1992 | Grabbe et al. ................ 439/71 |
| 5,280,139 A | * | 1/1994 | Suppelsa et al. ............ 174/260 |
| 5,665,648 A | * | 9/1997 | Little .......................... 438/117 |
| 5,801,441 A | * | 9/1998 | DiStefano et al. .......... 257/696 |
| 5,860,818 A | * | 1/1999 | Sakaki et al. ................. 439/91 |
| 5,914,218 A | | 6/1999 | Smith et al. |
| 6,101,371 A | * | 8/2000 | Barber et al. ................ 455/73 |
| 6,215,670 B1 | | 4/2001 | Khandros |
| 6,252,175 B1 | | 6/2001 | Khandros |
| 6,264,477 B1 | * | 7/2001 | Smith et al. .................. 439/66 |
| 6,290,510 B1 | | 9/2001 | Fork et al. |
| 6,392,524 B1 | * | 5/2002 | Biegelsen et al. .......... 336/200 |

* cited by examiner

*Primary Examiner*—Phuong Dinh
(74) *Attorney, Agent, or Firm*—Oliff & Berridge, PLC

(57) ABSTRACT

A multi-axis compliance spring includes at least an anchor portion attached to a surface of a substrate and a free portion detached from the substrate. The free portion includes at least one first section having at least one curvature originating from an internal stress in the free portion and a second section having at least one second curvature defined in a plane of the substrate prior to being detached from the free portion of the substrate.

22 Claims, 17 Drawing Sheets

Compliances in X and Y Directions

Compliance in Z Direction

Compliances in X and Y Directions

Compliance in Z Direction

Compliances in X and Y Directions

Compliance in Z Direction

Compliances in X and Y Directions

Compliance in Z Direction

MULTI-AXIS COMPLIANCE SPRING

This non-provisional application claims the benefit of U.S. provisional application No. 60/382,602, filed on May 24, 2002. The entire disclosure of the provisional application is hereby incorporated by reference herein in its entirety.

This invention was made with United States Government support under ATP Program Award no. 70NANB8H4008 award by NIST.

BACKGROUND OF THE INVENTION

1. Field of Invention

This invention relates to photolithographically-formed microelectronic interconnect structure.

2. Description of Related Art

Design and fabrication of integrated circuits (ICs) have made rapid advances which require similar advances in the design and fabrication of chip-to-substrate electrical interconnect structures, and of high density substrates. For example, millions of transistors can be fabricated onto a 10×10 mm die with input/output (I/O) pad densities reaching about 1600/cm$^2$. This fabrication will eventually reach a billion transistors or more on a 10×10 mm die, and, in response, the die-to-substrate I/O pad density will eventually reach about 6000/cm$^2$ or more.

SUMMARY OF THE INVENTION

If the die-to-substrate interconnect technologies do not keep pace with advances in semiconductor technologies, a bottleneck may result that hinders future advances in semiconductor technologies. In addition to fabrication constraints, low cost and reliability also influence die-to-substrate interconnect developments.

This invention provides systems and methods for a multi-axis spring compliance interconnect structure that comprises an anchor portion and a released portion. The released portion comprises a release portion, a curved portion and a tip portion. The interconnect structure may be defined by a plurality of geometric parameters which includes a length (L), a width (W), a subtended angle (α), and an inner radius (R), among other parameters. Various geometric parameters of the interconnect structure influence a release height (H) of the interconnect structure as well as, for example, the X, Y and Z-axis components of the spring compliance.

In various embodiments, the multi-axis spring compliance interconnect structure has an elastic member that includes an elastic material and that has an inherent stress gradient. In various embodiments, the elastic member has an anchor portion, a release portion, a curved portion and a tip portion. In various embodiments, the multi-axis spring compliance of the interconnect structure is produced by a thickness of the elastic member. In various embodiments, the multi-axis spring compliance of the interconnect structure is produced by a width of the elastic member. In various embodiments, the multi-axis spring compliance of the interconnect structure is produced by a length of the release portion. In various embodiments, the multi-axis spring compliance of the interconnect structure is produced by a subtended angle of the curved portion. In various embodiments, the multi-axis spring compliance is produced by an inner radius of the curved portion.

These and other features and advantages of the invention are described in, or are apparent from, the following description of various exemplary embodiments of the systems and methods according to the invention.

BRIEF DESCRIPTION OF THE DRAWINGS

Various exemplary embodiments of this invention will be described in detail with reference to the following figures, wherein.

DETAILED DESCRIPTION OF PREFERRED EMBODIMENTS

Figure 1:
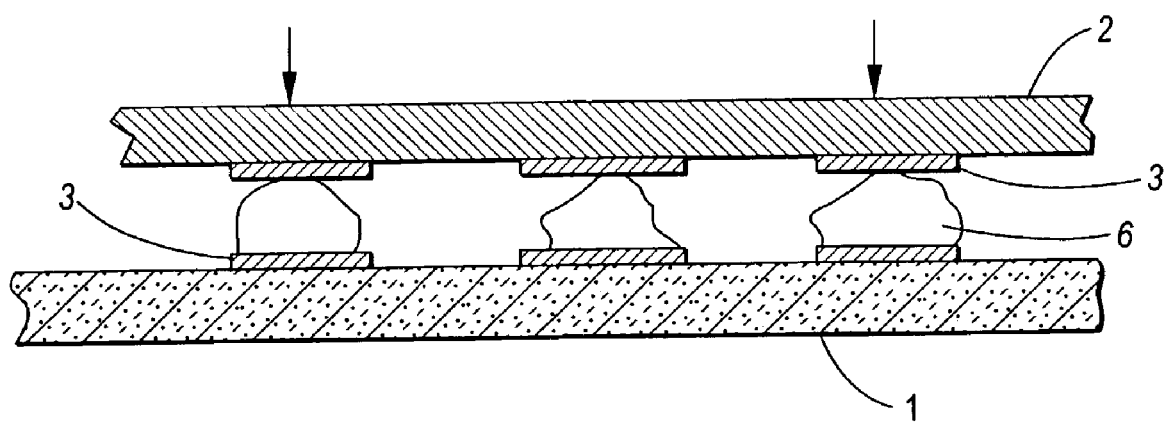
FIG. 1 shows a conventional solder bump "flip-chip" bonding technique for bonding a chip to a substrate.

FIG. 1 shows a conventional solder bump "flip-chip" bonding technique for bonding contact pads 3 formed on a chip 2 to the contact pads 3 formed on a substrate 1. Solder bumps 6 are formed on the contact pads 3 of the substrate 1 or on those of the chip 2. The corresponding contact pads 3 are electrically connected by pressing the contact pads 3, which the solder bumps 6 are not formed on, against the solder bumps 6 and melting the solder bumps 6. The deformation of the solder bumps 6 compensate for some irregularity in the heights of the contact pads 3 and any uneven contacting pressure forcing those contact pads 3 against the solder bumps 6. However, the flip-chip bonding technique suffers from mechanical and thermal variations in the solder bumps 6. For instance, if the solder bumps 6 are not uniform in height, or if the substrate 1 is warped, contact between some contact pads 3 and corresponding solder bumps 6 can be broken. Also, if the contacting pressure forcing those contact pads 3 against the solder bumps 6 is uneven, contact between some contact pads 3 and corresponding solder bumps 6 can fail. In addition, stresses from thermal expansion mismatches between the chip 2 and the substrate 1 can break the bonds between the contact pads 3 formed by the solder bumps 6.

Figure 2:
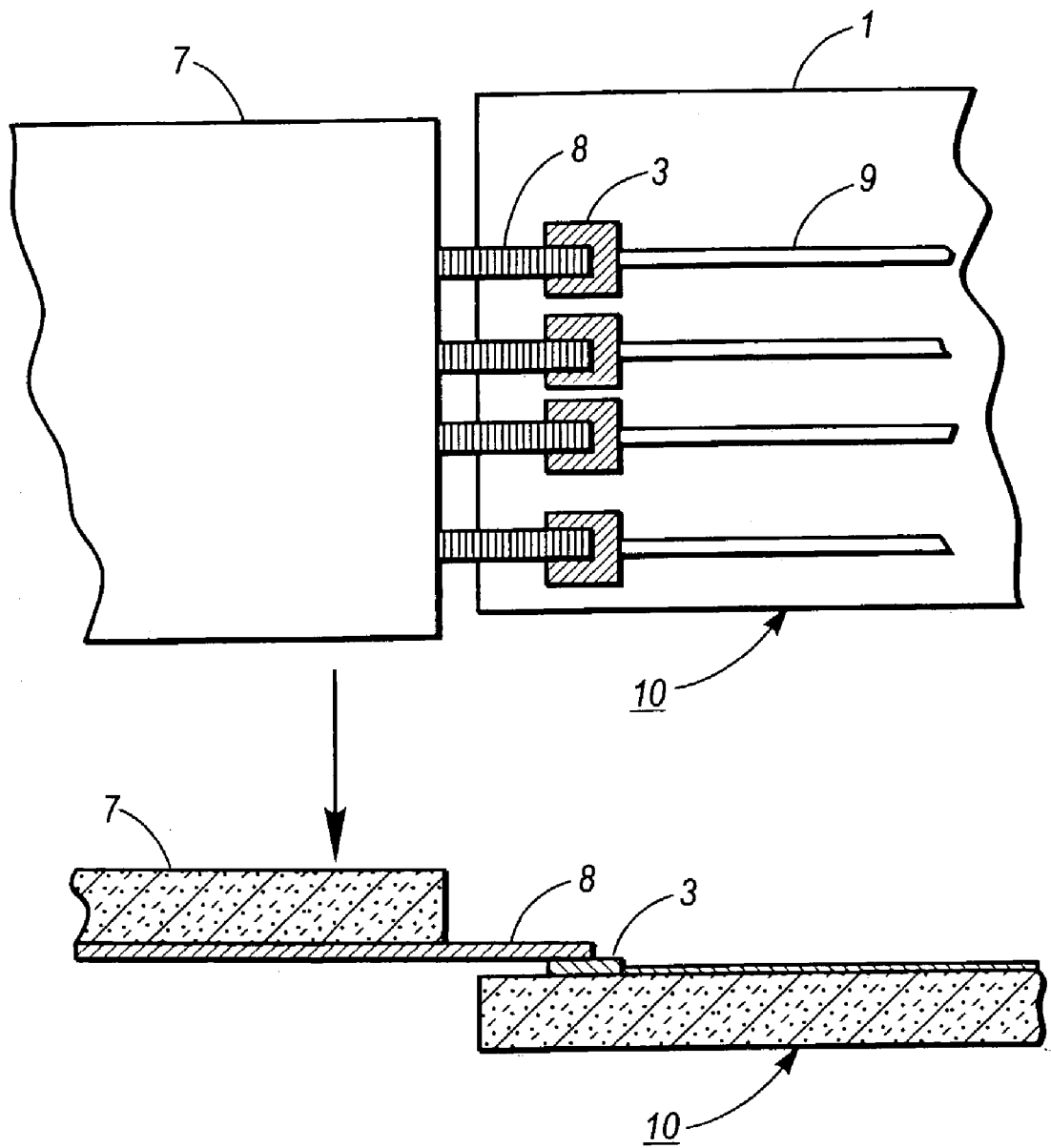
FIG. 2 shows a conventional technique for establishing a temporary electrical contact between two devices.

FIG. 2 shows a conventional technique for establishing a temporary electrical contact between two devices. A probe card 7, having a plurality of probe needles 8, contacts the contact pads 3 by physically pressing the probe needles 8 against the contact pads 3. The physical contact between the probe needles 8 and the contact pads 3 electrically connects the probe needles 8 and the lines 9 formed on the substrate 1. The probe cards 7 are generally used to create only temporary contacts between the probe needles 8 and the contact pads 3, so that the device 10 can be tested, interrogated, or otherwise communicated with. The device 10 can be, for example, a matrix of display electrodes which are part of an active-matrix liquid crystal array display.

The probe card 7 has many more applications other than for testing a liquid crystal display. Any device 10 having numerous and relatively small contact pads 3 similar to those found on the chip 2 can be tested using the probe card 7. However, conventional techniques for producing the probe card 7 are time consuming and labor intensive. Each probe card 7 is custom made for the particular device 10 to be tested. Typically, the probe needles 8 are manually formed on the probe card 7. Because the probe card 7 is custom made and relatively expensive, the probe cards 7 are not typically made to contact all of the contact pads 3 on the device 10 at one time. Therefore, only portions of the device 10 can be communicated with, tested or interrogated at any one time, requiring the probe card 7 be moved to allow communication, testing or interrogation of the entire device 10.

Figure 3:
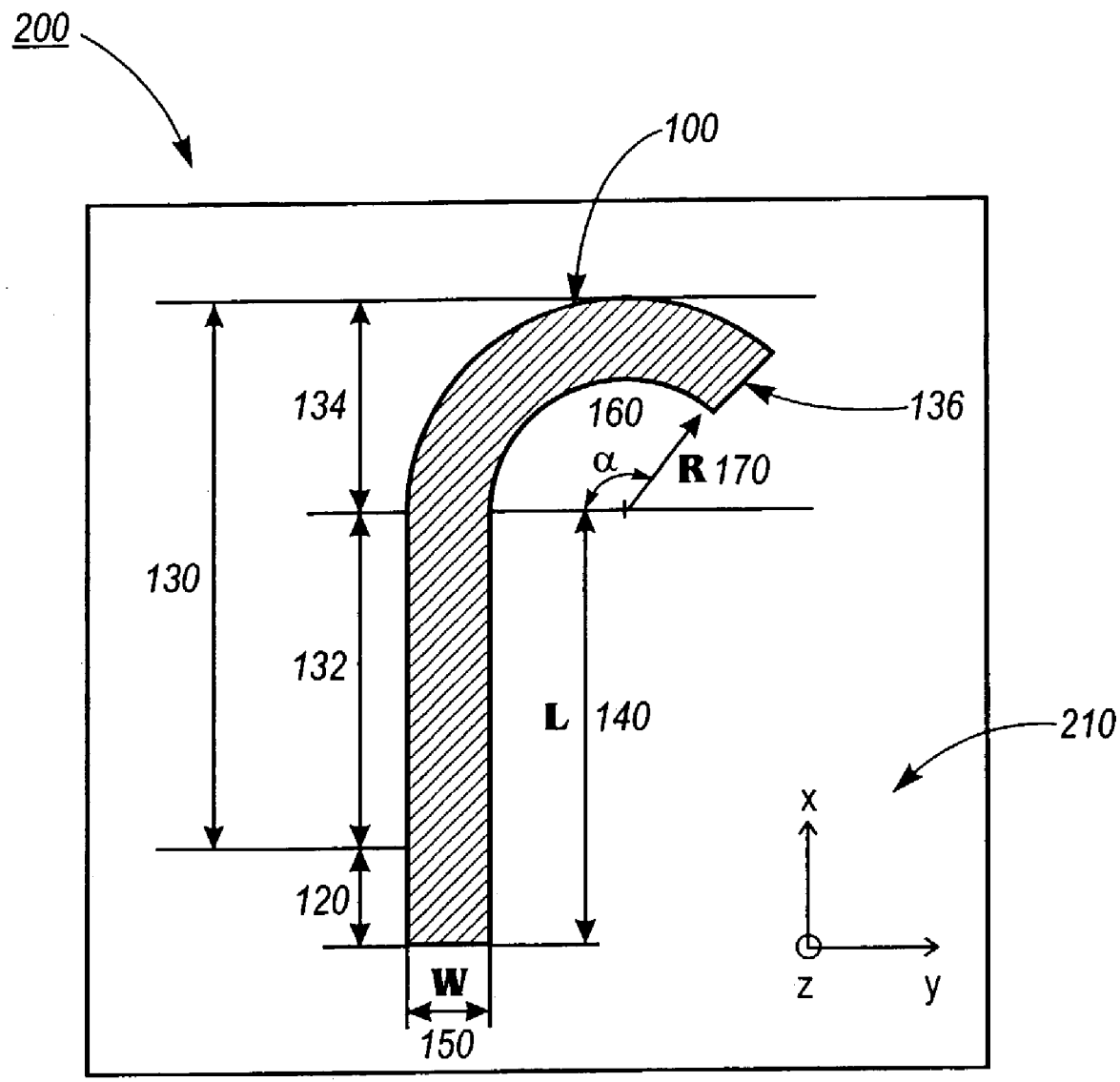
FIG. 3 is a top view of a first exemplary embodiment of an interconnect structure having multi-axis spring compliance according to this invention.

FIG. 3 shows a top view of an exemplary interconnect structure 100 having multi-axis spring compliance (C) according to this invention. As shown in FIG. 3, in various exemplary embodiments, the interconnect structure 100 is disposed on a substrate 200. The multi-axis spring compliance interconnect structure 100 includes an anchor portion 120 and a released portion 130. The released portion 130 comprises a release portion 132, a curved portion 134 and a tip portion 136. The interconnect structure 100 is defined by a plurality of geometric parameters which includes a length (L) 140, a width (W) 150, a subtended angle (α) 160, and an inner radius (R) 170, among other parameters. Various geometric parameters of the interconnect structure 100 influence a release height (H) 180 (see, for example, FIG. 16) of the interconnect structure 100 as well as, for example, the X, Y and Z-axis components $C_x$, $C_y$ and $C_z$ of the spring compliance (C). The X-Y plane may represent a substrate surface 210 containing the interconnect structure 100. The Z-axis may represent the direction normal to the substrate surface 210. The influences the various geometric parameters have in shaping the interconnect structure 100 allow for the interconnect structure 100 to have a predetermined compliances $C_x$, $C_y$ and $C_z$ in each of the X, Y, and Z-axis, directions respectively, that, for example, accommodates the differential displacement between a die to be connected to the substrate 200 by the interconnect structure 100 and the substrate 200 due to mechanical displacements and/or mismatches in the coefficients of thermal expansion (CTE) of these elements under thermal excursions.

Figure 4:
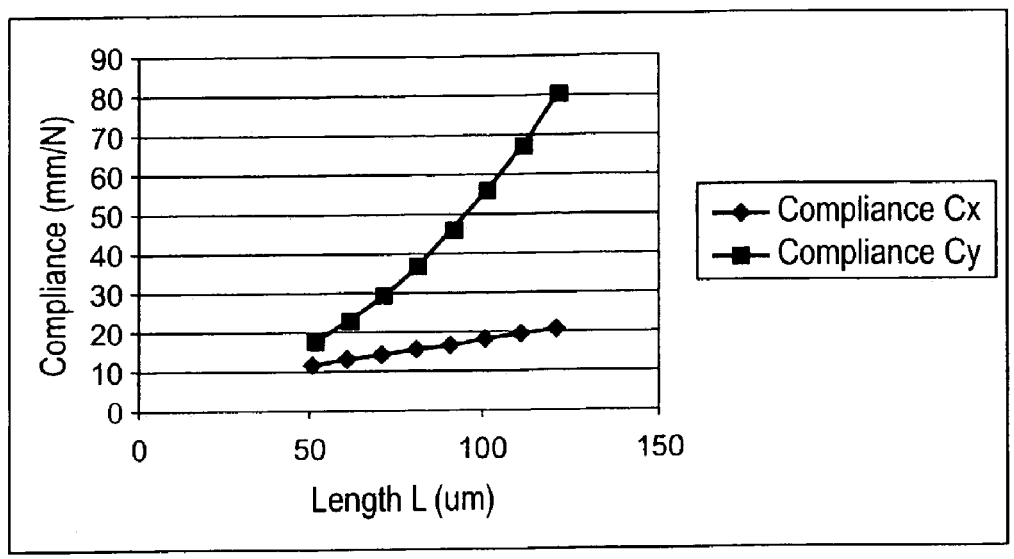
FIGS. 4 and 5 are graphs that show the compliance of the interconnect structure in the X, Y and Z axis dimensions, as a function of the length of the interconnect structure for the exemplary embodiment of the interconnect structure shown in FIG. 3 along the X, Y and Z axes.
Figure 5:
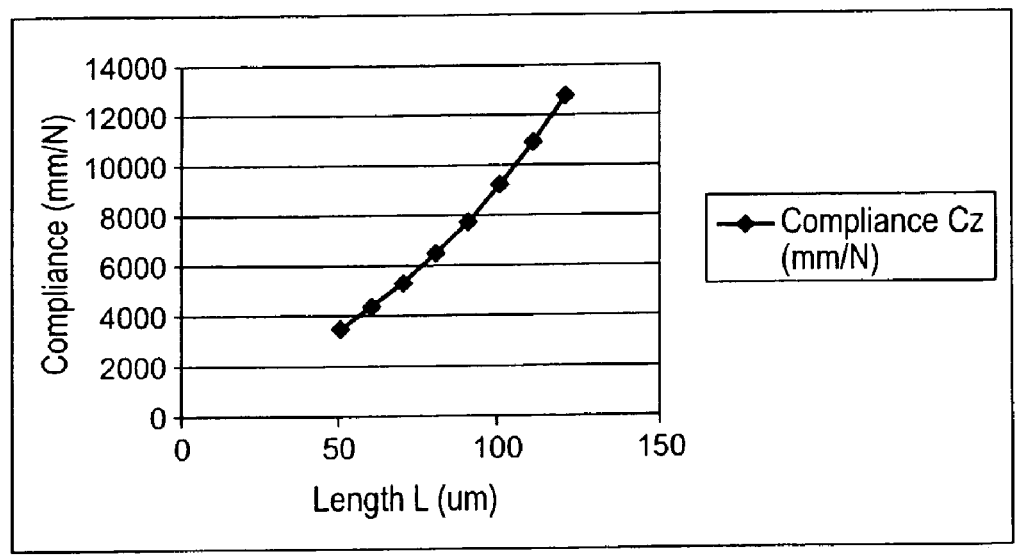

FIGS. 4 and 5 are graphs that show the compliance $C_x$, $C_y$ and $C_z$ of the interconnect structure 100 in each of the X, Y and Z-axis directions and having 90° subtended angle 160. In particular, FIGS. 4 and 5 illustrate that the compliance C of the interconnect structure 100 increases as the interconnect length (L) 140 of the interconnect structure 100 increases. Usually, the compliance $C_z$ in the Z-axis direction is larger than the compliances $C_x$ and $C_y$ in either the X-axis direction or the Y-axis direction. This may be explained by the moment of inertia I for a rectangular cross section of the interconnect structure 100, which can be expressed as:

$$I = \frac{WT^3}{12} \quad (1)$$

W is the width of the cross-section of the interconnect structure 100; and

T is the thickness of the cross-section of the interconnect structure 100.

In various exemplary embodiments, the interconnect structure 100 has a thickness of approximately 1 μm and has a width of approximately 10 μm. Since the Z-axis moment of inertia $I_z$ is smaller than the X-Y plane moment of inertia $I_{xy}$, the compliance $C_z$ of the interconnect structure 100 in the Z-axis direction is larger than both of the compliances $C_x$ and $C_y$ of the interconnect structure 100 in the X-axis direction and the Y-axis direction.

Figure 6:
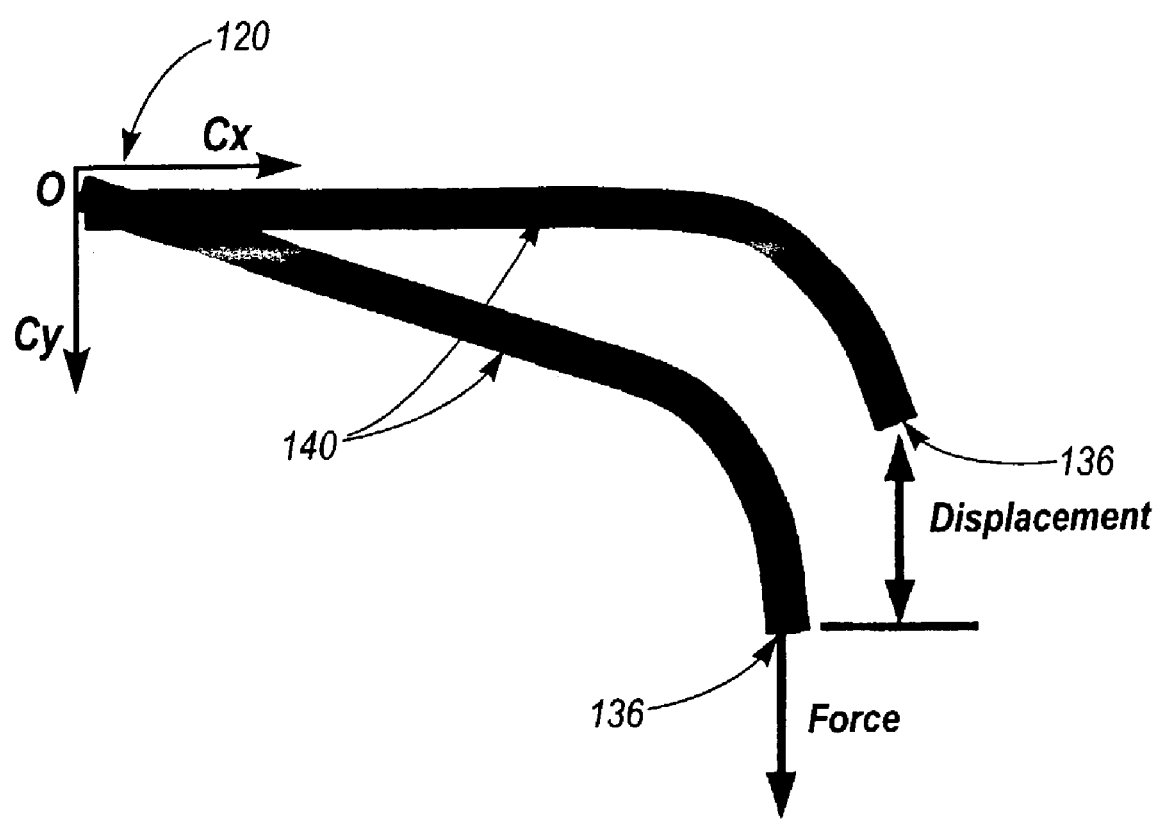
FIG. 6 is a schematic diagram that shows the X-axis compliance and the Y-axis compliance of the interconnect structure with respect to the length of the interconnect structure for the exemplary embodiment of the interconnect structure shown in FIG. 3.

In various exemplary embodiments, the compliance $C_x$ of the interconnect structure 100 in the X-axis direction is smaller than the compliance $C_y$ of the interconnect structure 100 in the Y-axis direction. As shown in FIG. 6, the X-axis extends along the longitudinal direction of the interconnect structure 100. The Y-axis extends perpendicular to the X-axis within an X-Y plane. In addition, because the subtended angle 160 of the interconnect structure 100 is approximately 90°, the subtended angle 160 influences the compliances $C_x$ and $C_y$ of the interconnect structure 100 in the X-axis and the Y-axis directions. The influence of the subtended angle ($\alpha$) 160 on the X, Y and Z-axis compliances $C_x$, $C_y$ and $C_z$, respectively, of the interconnect structure 100 will be further described with respect to FIGS. 7–11.

Using the anchor portion 120 of the interconnect structure 100 as a pivot of the X-Y plane rotation anchored on the substrate 200 and the origin of the X-Y plane coordinate system, the normal distance from the interconnect tip portion 136 to the X-axis is less than the distance from the interconnect tip portion 136 to the Y-axis. The displacement of the tip portion 136 with respect to the anchor portion 120 is measured after a force is applied to the interconnect tip portion 136. The difference between these two distances becomes larger as the length 140 increases. Consequently, the Y-axis compliance $C_y$ of the interconnect structure 100 increases faster than the X-axis compliance $C_x$ of the interconnect structure 100. As the interconnect length 140, and thus the release height (H) 180, plays a role in the X, Y and Z-axis compliances $C_x$, $C_y$ and $C_z$ of the interconnect structure 100, various geometric parameters that provide for a desired release height (H) 180 at the interconnect tip portion 136 need to be considered.

Figure 7:
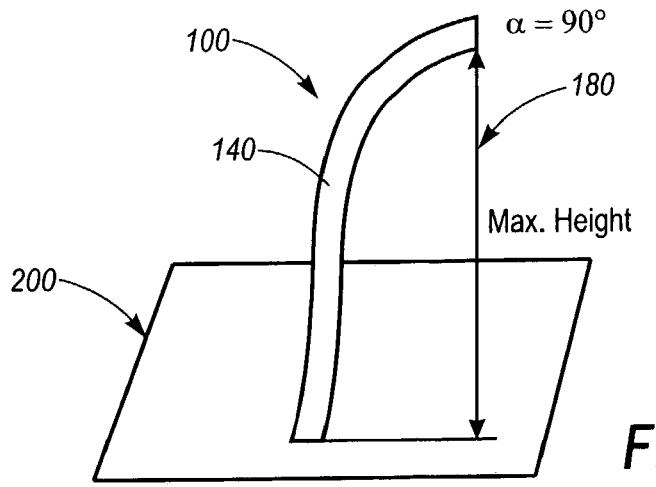
FIGS. 7, 8 and 9 are schematic diagrams that show the influence of a subtended angle (α) on the compliance of the interconnect structure for the exemplary embodiment of the interconnect structure shown in FIG. 3.
Figure 8:
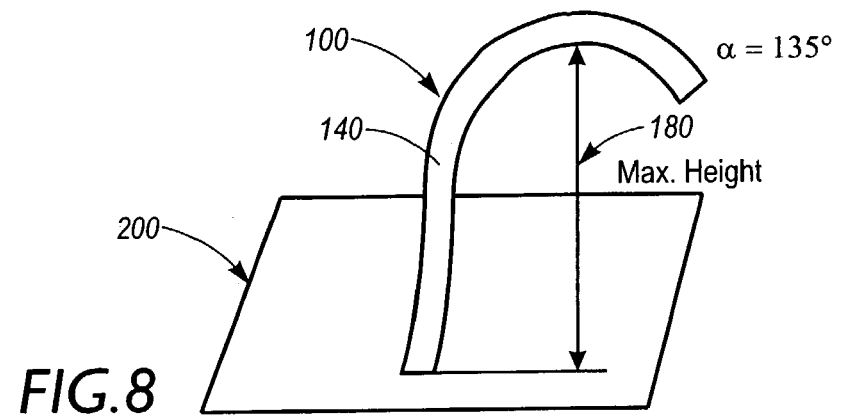
Figure 9:
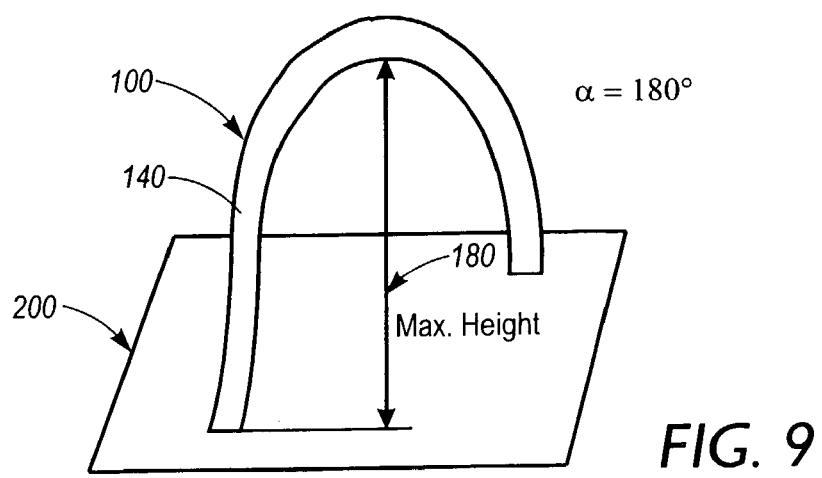

FIGS. 7–9 illustrate the influence of the subtended angle 160 on the compliance C of the interconnect structure 100. In the exemplary embodiment of the interconnect structure 100 illustrated in FIGS. 7–9, the interconnect structure 100 has a thickness of approximately 1 $\mu$m, a width (W) 150 of approximately 10 $\mu$m, a release height (H) 180 of approximately 30 $\mu$m and an inner radius (R) 170 of approximately 50 $\mu$m. However, the subtended angle ($\alpha$) 160 of the interconnect structure 100 is approximately 90°, 135° and 180° in FIGS. 7, 8 and 9, respectively. As shown in FIGS. 7–9, the released height (H) 180, which is the normal distance from the substrate surface 210 to the interconnect tip portion 136, increases monotonically until the subtended angle ($\alpha$) 160 begins to exceed a threshold angle $\alpha_T$. Depending on how the interconnect structure 100 is formed, the threshold angle $\alpha_T$ is somewhere in the range of approximately 120°. Beyond this threshold angle $\alpha_T$, any further increase in the subtended angle ($\alpha$) 180 causes the interconnect tip portion 136 to fall back towards the substrate surface 210.

In the exemplary embodiment shown in FIG. 7, the subtended angle ($\alpha$) 160 is approximately 90°. In this exemplary embodiment, the release height (H) 180 increases continuously as the length (L) 140 increases. In this exemplary embodiment, the maximum height is located at the interconnect tip portion 136. However, in the exemplary embodiments shown in FIGS. 8 and 9, for the subtended angles ($\alpha$) 160 of approximately 135° and 180°, respectively, the release height (H) 180 does not increase monotonically. Instead, in the exemplary embodiments shown in FIGS. 8 and 9, the release height (H) 180 reaches a maximum height at approximately roughly 120°. The release height then starts to decrease from this maximum height.

Figure 10:
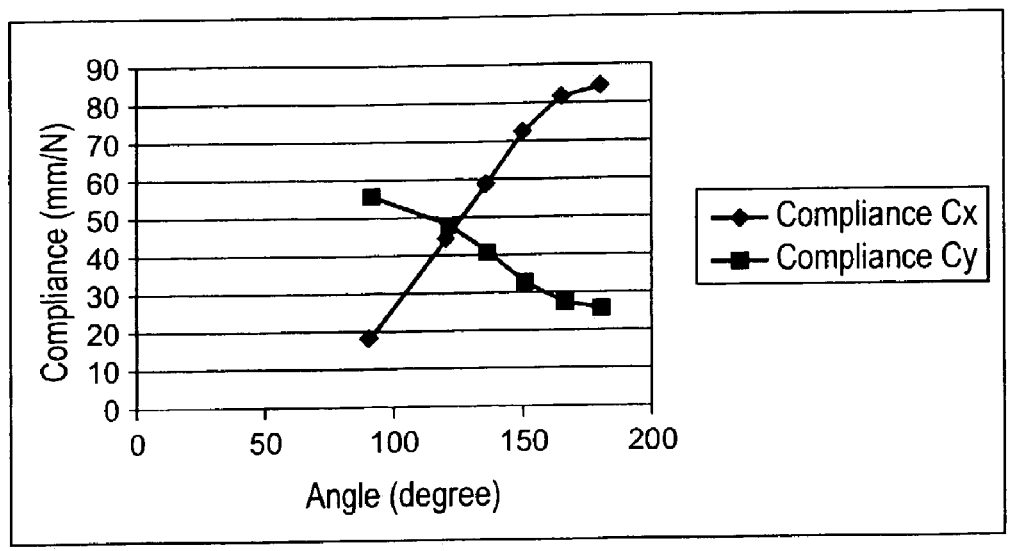
FIGS. 10 and 11 are graphs that show the compliance of the interconnect structure in the X, Y and Z-axis directions as a function of the subtended angle (α) of the interconnect structure for the exemplary interconnect structure shown in FIG. 3.
Figure 11:
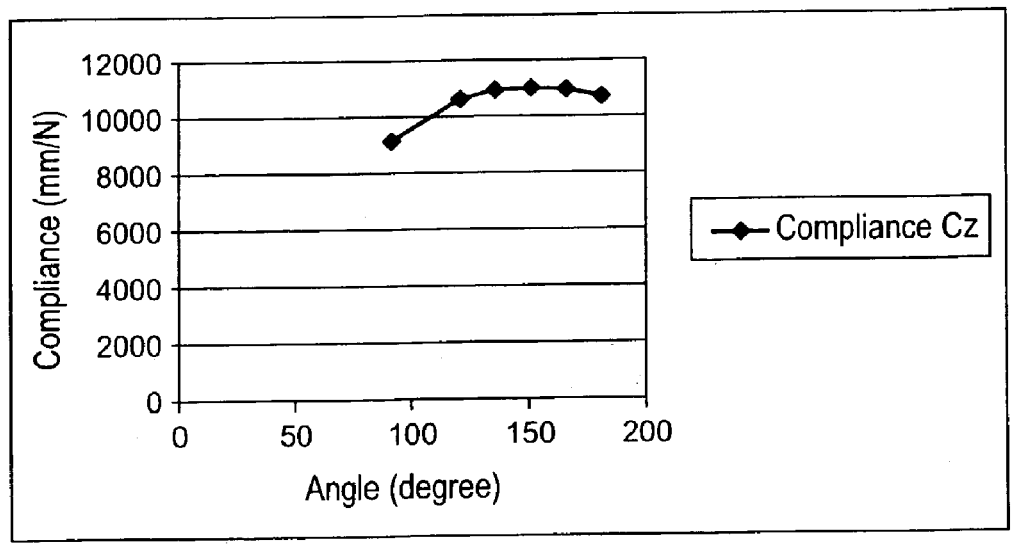

FIGS. 10 and 11 are graphs that show the compliances of the interconnect structure 100 shown in FIG. 3 in the X, Y and Z-axis directions $C_x$, $C_y$ and $C_z$, respectively, as a function of the subtended angle ($\alpha$) 160. As shown in FIG. 11, the Z-axis compliance $C_z$ of the interconnect structure 100 increases and reaches a maximum when the subtended angle ($\alpha$) 160 is approximately 150°. After the subtended angle ($\alpha$) 160 reaches approximately 150°, the Z-axis compliance $C_z$ of the interconnect structure 100 decreases with further increases in the subtended angle ($\alpha$) 160. For the X-axis compliance $C_x$, the normal distance from the interconnect tip portion 136 to the release portion 132 keeps increasing as long as the subtended angle ($\alpha$) 160 increases, as shown in FIG. 10. However, the rate of increase becomes smaller $C_x$ as the subtended angle ($\alpha$) 160 approaches to 180°. For the Y-axis compliance of the interconnect structure 100, the normal distance from the interconnect tip portion 136 to the anchor portion 120 increases with the subtended angle ($\alpha$) 160 until the subtended angle ($\alpha$) 160 exceeds approximately 90°. The Y-axis compliance $C_y$ of the interconnect structure 100 decreases as the subtended angle ($\alpha$) 160 increases when the subtended angle ($\alpha$) 160 is between approximately 90° and approximately 180°. In particular, for some exemplary embodiments of the interconnect structure 100 according to this invention, the optimum compliance C of the interconnect structure 100 increases in the X-axis, the Y-axis and the Z-axis directions is reached when the subtended angle ($\alpha$) 160 is approximately 120°. Therefore, in the exemplary embodiments, the optimum release height (H) 180 of the interconnect tip portion 136 is obtained when the subtended angle ($\alpha$) 160 is approximately 120°.

Figure 12:
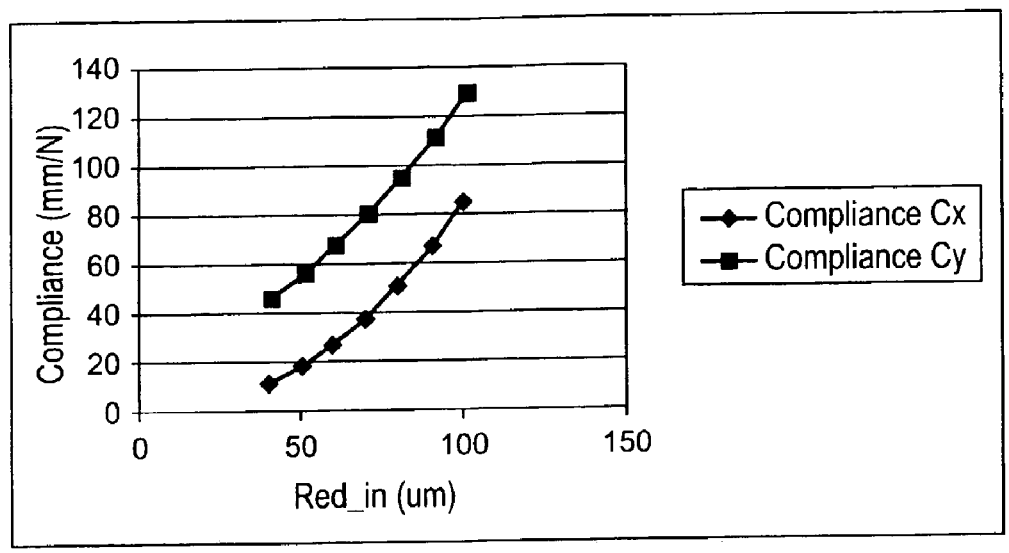
FIGS. 12 and 13 are graphs that show the compliance of the interconnect structure in the X, Y and Z-axis directions as a function of the inner radius (R) of the interconnect structure for the exemplary embodiment of the interconnect structure shown in FIG. 3.
Figure 13:
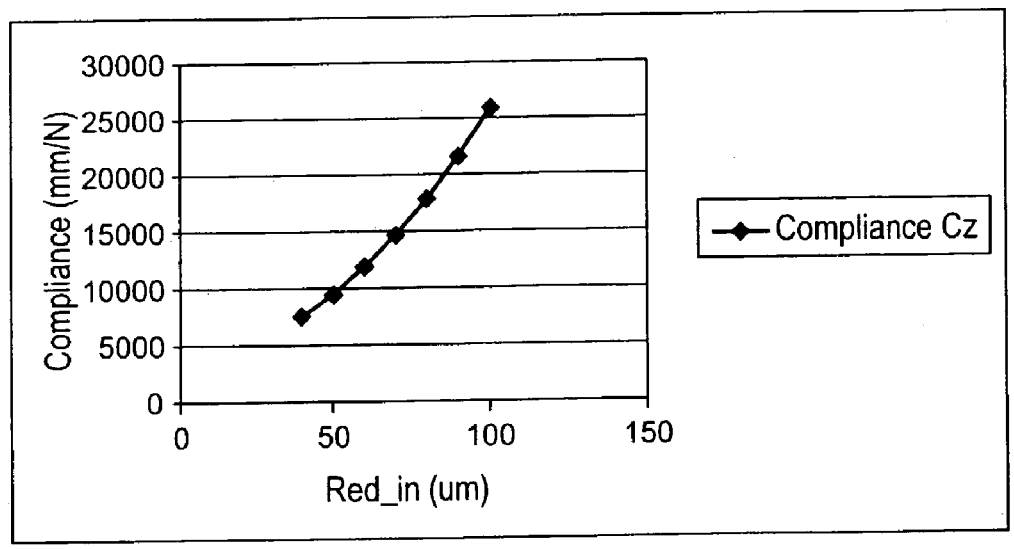

FIGS. 12 and 13 are graphs that show the influence of the inner radius (R) 170 on the X, Y and Z-axis compliances $C_x$, $C_y$ and $C_z$, respectively, of the interconnect structure 100. As shown FIGS. 12 and 13, increasing the inner radius (R) 170 increases all of the X-axis; Y-axis and Z-axis compliances $C_x$, $C_y$ and $C_z$, respectively, of the interconnect structure 100. Unlike the interconnect length (L) 140, increasing inner radius (R) 170 simultaneously makes the normal distances from the interconnect tip portion 136 to the X-axis and the Y-axis longer. Therefore, the X-axis compliance $C_x$ and the Y-axis compliance $C_y$ is inner radius compliance curve are approximately parallel to each other. The Z-axis compliance $C_z$ of the interconnect structure 100 also increases as the inner radius (R) 170 increases.

Figure 14:
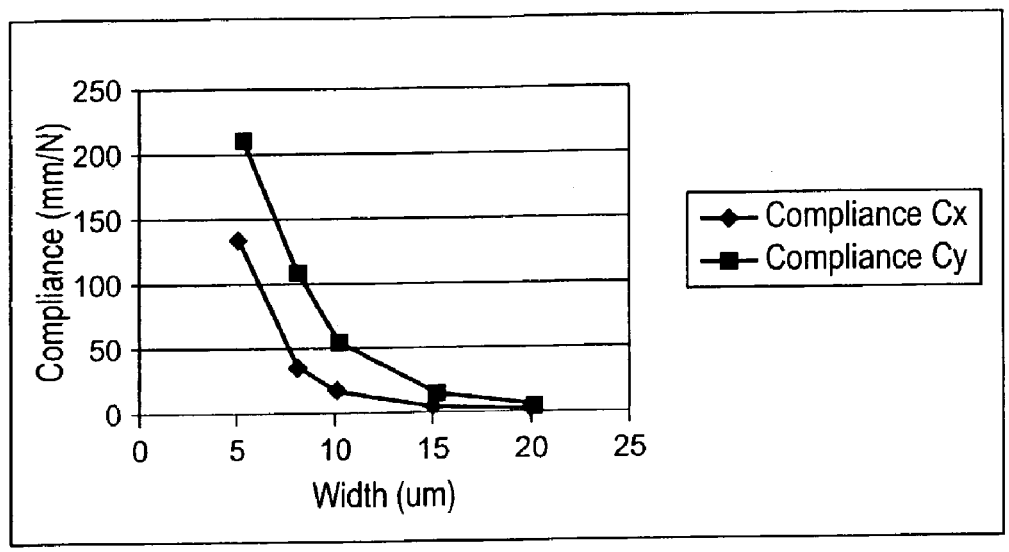
FIGS. 14 and 15 are graphs that show the compliance of the interconnect structure in the X, Y and Z-axis directions as a function of the width (W) of the interconnect structure for the exemplary embodiment of the interconnect structure shown in FIG. 3.
Figure 15:
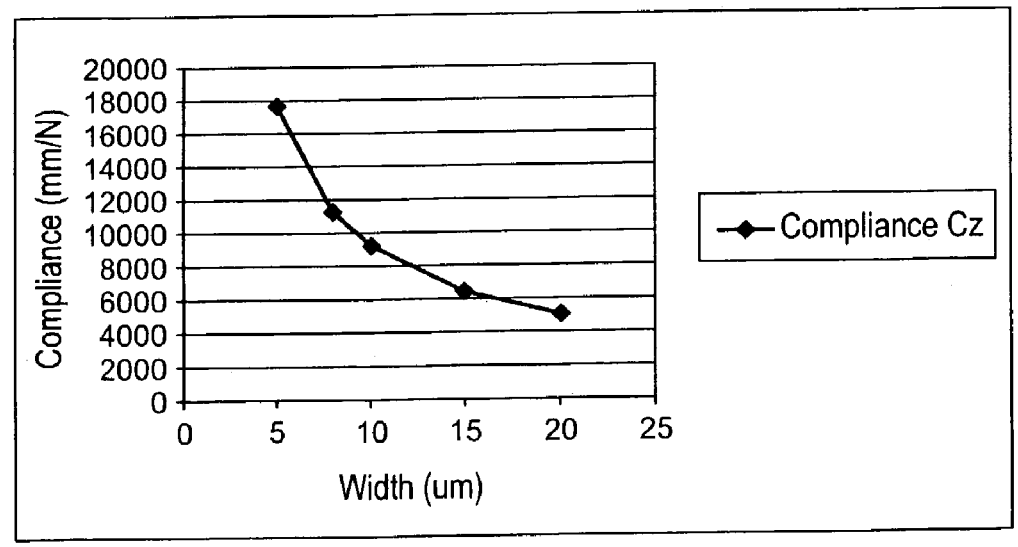

FIGS. 14 and 15 are graphs that show the influence of the width (W) 150 on the X, Y and Z-axis compliances $C_x$, $C_y$ and $C_z$, respectively, of the interconnect structure 100. As shown in FIGS. 14 and 15, increasing the width (W) 150 decreases all of the X-axis, Y-axis and Z-axis compliances $C_x$, $C_y$ and $C_z$. For example, the X-axis compliance $C_x$ and the Y-axis compliance $C_y$ significant decrease when the width (W) 150 increases from approximately 5 $\mu$m to approximately 10 $\mu$m. However, because narrow interconnects structures 100 are susceptible to damage, a wider interconnect structure 100 may be desirable at the expense of its compliance (C).

Figure 16:
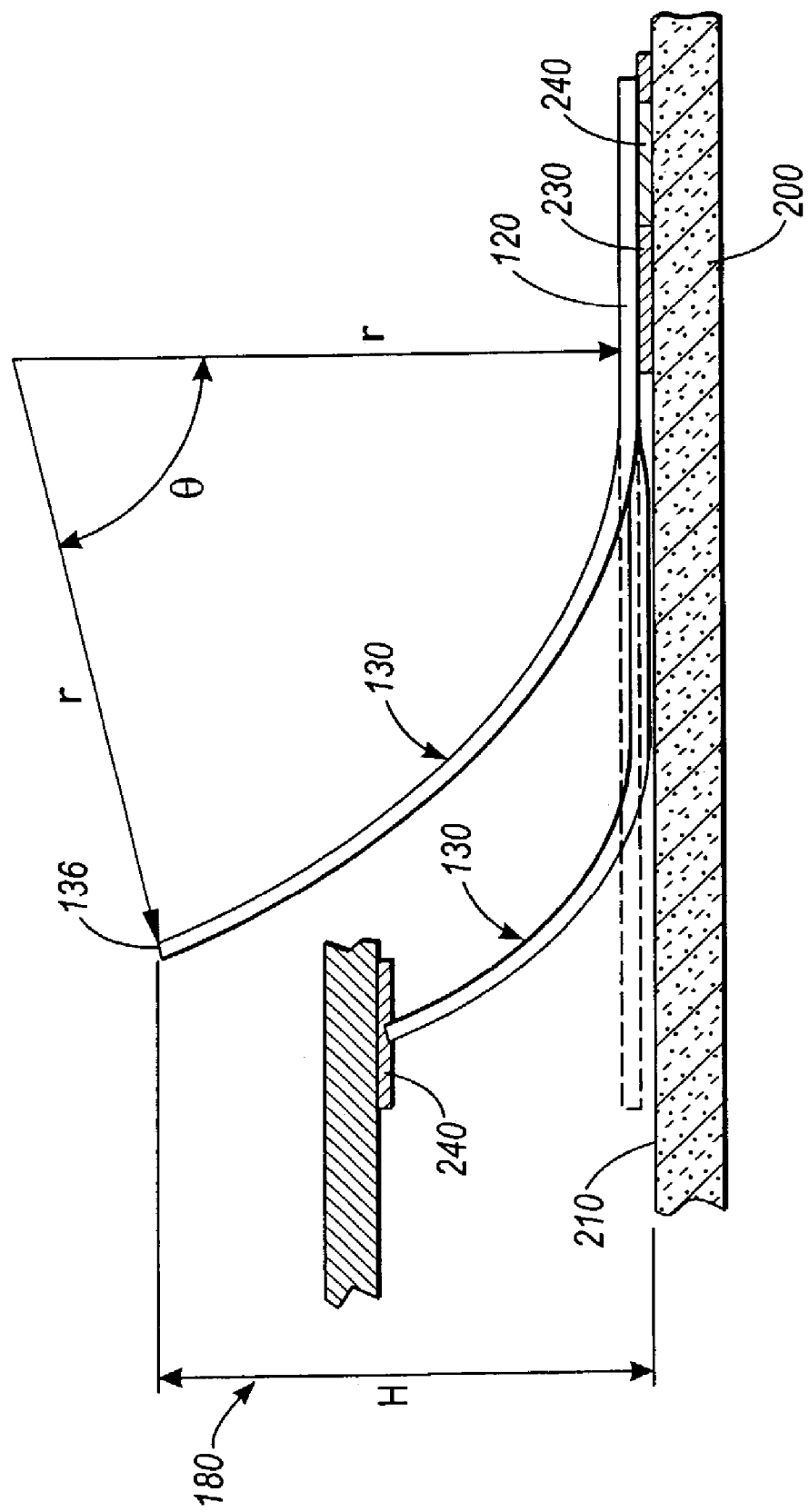
FIG. 16 is a side view of a plurality of the interconnect structures shown in FIG. 3.

FIG. 16 shows a side view of a number of the interconnect structures 100 having a multi-axis compliance disposed on the substrate 200. Each of the interconnect structures 100 has an anchor portion 120 that is fixed to an insulating underlayer 230 and electrically connected to a contact pad 240 formed on the substrate 200. One or more of the interconnect structures 100 may be made of an extremely elastic material, such as a chrome-molybdenum (MoCr) alloy or a nickel-zirconium (NiZr) alloy. In various embodiments, at least some of the interconnect structures 100 are formed using a conductive elastic material, although one or more of the interconnect structures 100 can be formed of a nonconductive or semi-conductive material if such an interconnect structure 100 is coated or plated with a conductive material. In various embodiments, one or more of the interconnect structures 100 are formed using an alloy comprising about 80% molybdenum (Mo) and about 20% chromium (Cr) by weight. The elastic properties of such an interconnect structure 100 is mainly attributed to the elastic properties of MoCr. When the elastic material used to form the interconnect structures 100 is not conductive, such interconnect structures 100 can be coated on at least one side with a conductive material, such as a metal or metal alloy.

The contact pad 240 on the substrate 200 may be a terminal end of a communication line that electrically communicates with an electronic element or device, such as a transistor, a display electrode, or any other known or future-developed electronic element or device. The contact pad 240 is often made of aluminum, but can be made of any conductive material. If the contact pad 240 is made of aluminum, the contact pad 240 may be coated with gold, indium tin oxide, nickel or the like. The insulating underlayer 230 is often made of silicon nitride or other etchable insulating material. In various embodiments, the insulating underlayer 230 may not be necessary and can be omitted. The insulating underlayer 230 and the contact pad 240 on the substrate 200 are formed on or over the substrate 200. The substrate 200 is also often formed of an insulating material, such as oxidized silicon or glass.

Figure 17:
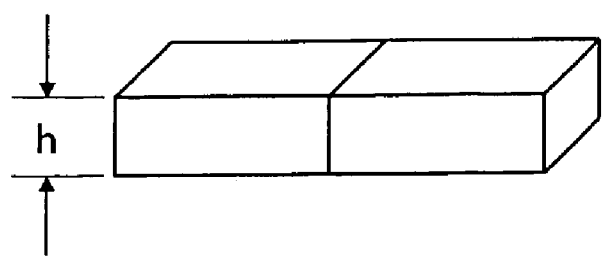
FIG. 17 shows a metal strip with no stress gradient.
Figure 18:
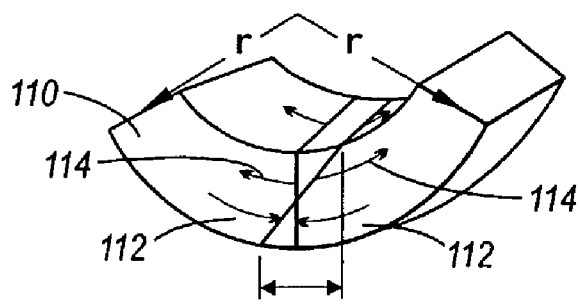
FIG. 18 shows a model usable to determine a curvature of an interconnect structure according to this invention due to a stress gradient.

As shown in FIG. 17, a strip of metal having no stress gradient inherent in the metal will lie flat. However, as shown in FIG. 18, when the strip is bent into an arc, a uniform stress gradient $\Delta\sigma/h$ is introduced into the strip. In contrast, if a uniform stress gradient $\Delta\sigma/h$ is introduced into the flat metal strip, that metal strip will bend into an arc shape.

In FIG. 18, each interconnect structure 100 is formed such that a stress gradient $\Delta\sigma/h$ is introduced into that interconnect structure 100. When such an interconnect 100 is formed, the metal layer 110 comprising the interconnect structure 100 is deposited such that compressive stress is present in the lower portions, as indicated by arrows 112 in the metal layer 110 and tensile stress is present in the upper portions of the metal layer 110, as indicated by upper arrows 114. The stress gradient $\Delta\sigma/h$ causes the interconnect structure 100 to bend into the shape of an arc having a radius r. The radius of curvature r of the interconnect structure 100, as a function of the stress gradient $\Delta\sigma/h$, is:

$$r = \left(\frac{Y}{1-v}\right)\frac{h}{\Delta\sigma}, \qquad (2)$$

where:
Y is the Young's modulus of the material;
h is the thickness of the material layer 110 forming the interconnect structure 100;
$\Delta\sigma$ is the total stress difference in the metal layer 110; and
v is the value of Poisson's ratio for the material forming the metal layer 110.

As shown in FIG. 16, since, in various exemplary embodiments, the interconnect structure 100 is made of a highly elastic material, while the interconnect structure 100 may be pushed down at the interconnect tip portion 136 and deformed, the interconnect structure 100 will not plastically deform. Typically, a contact pad 240 of a device exerts the downward force placed on the interconnect tip portion 136 and electrically contacts the interconnect tip portion 136. The interconnect structure 100 resists the downward force placed on the interconnect tip portion 136 and maintains electrical contact with the contact pad 240.

When the force on the interconnect tip portion 136 is released, the interconnect structure 100 will return to its original state. Thus, the elasticity of the interconnect structure 100 allows the interconnect structure 100 to make numerous successive electrical connections with different contact pads 240 while maintaining the integrity of the electrical connection between the interconnect tip portion 136 and the contact pad 240.

Additionally, in various exemplary embodiments, the interconnect structure 100 is made of a creep-resistant material. Therefore, when the interconnect structure 100 is elastically deformed over an extended period by being pressed down by a contact pad 240 placed against on the interconnect tip portion 136, the interconnect structure 100 resists the downward force and pushes the interconnect tip portion 136 against the contact pad 240, maintaining the electrical connection.

Figure 19:
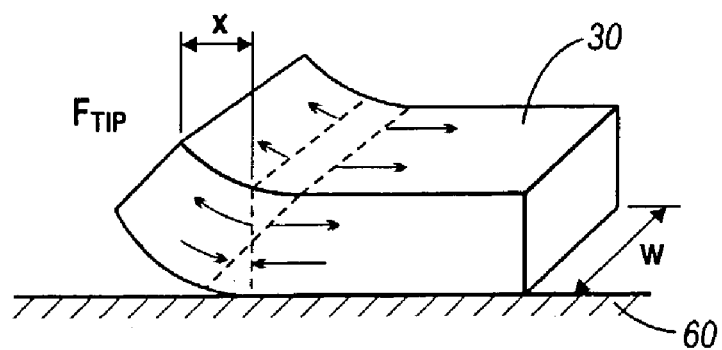
FIG. 19 shows a model usable to determine an amount of reaction force exerted at the tip of an interconnect structure according to this invention.

FIG. 19 shows a model for determining the amount of force $F_{tip}$ applied by the interconnect tip portion 136 to a contact pad 240 in reaction to the force of the contact pad 240 pressing down on the interconnect tip portion 136. The reaction force $F_{tip}$ of the interconnect tip 136 portion is:

$$F_{tip} = \frac{wh2\Delta\sigma}{12x}, \qquad (3)$$

where
w is the width of the interconnect structure 100;
h is the thickness of the interconnect structure 100;
$\Delta\sigma$ is the total stress difference; and
x is the horizontal distance from the interconnect tip 136 to the point where the interconnect structure 100 first touches the substrate 200.

As indicated by Eq. (3), for a given width w, thickness h and stress difference $\Delta\sigma$, the reaction force $F_{tip}$ of the interconnect tip 136 varies inversely with the distance x. Therefore, as shown in FIG. 16, the reaction force $F_{tip}$ increases as the interconnect tip portion 136 gets closer to the substrate 200, since the distance x decreases as the interconnect structure 100 is pressed against the substrate 200. The increase in the reaction force $F_{tip}$ as the contact pad 240 presses the interconnect tip portion 139 closer to the substrate 200 generally improves the electrical connection between the interconnect tip portion 136 and the contact pad 240. The increasing reaction force $F_{tip}$ causes the interconnect tip portion 136 and/or the contact pad 240 to deform locally at the area of contact, increasing the area of contact between the contact pad 240 and the interconnect tip portion 136.

Referring back to FIG. 3, it should be appreciated that because of the design and processing of the interconnect structure, the curved portion 134 has its axis of curvature substantially perpendicular to the top surface of the interconnect structure. Also, referring to FIG. 16, it should be appreciated that because of the stress gradient present in the interconnect structure, the released portion 130 has its axis of curvature substantially parallel to a top surface of the interconnect structure.

Figure 20:
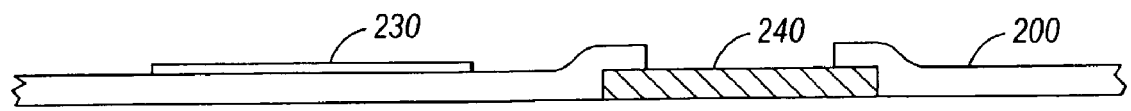
FIGS. 20–23 outline one exemplary embodiment of a method for forming an exemplary multi-axis spring compliance interconnect according to the invention.

FIGS. 20–23 show one exemplary embodiment of a method for forming the interconnect structure 100. As shown in FIG. 20, a contact pad 240 is formed on or over the substrate 200. Additionally, the insulating underlayer 230 is formed on or over the substrate 200. However, as mentioned above, in various exemplary embodiments, the insulating underlayer 230 is not necessary and may be omitted.

Figure 21:
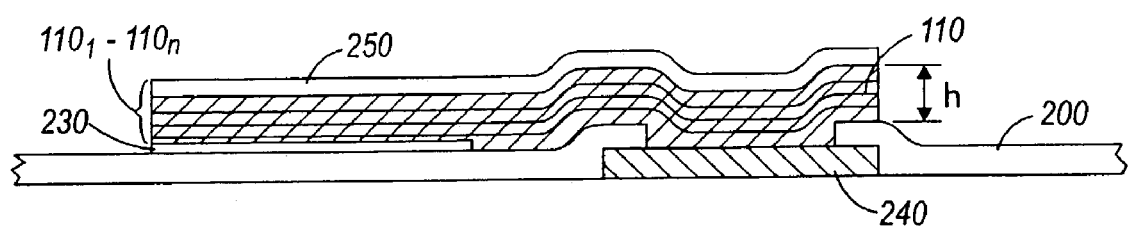

As shown in FIG. 21, the layer of metal 110 is deposited on or over the substrate 200. In various exemplary embodiments, the metal is the MoCr alloy described above. Part of the metal layer 110 is electrically connected to or directly contacts the contact pad 240. Another portion of the metal layer 110 is deposited on or over the insulating underlayer 230. There are many techniques available for depositing the metal layer 110 on or over the substrate 200, including electron-beam deposition, thermal evaporation, chemical vapor deposition, sputter deposition, electroplating and other appropriate known or future-developed techniques. In various exemplary embodiments, the metal layer 110 is sputter deposited.

In various exemplary embodiments, the metal layer 110 is deposited in several sub-layers $110_1$ to $110_n$ to a final thickness h of approximately 1 μm. The desired stress gradient Δσ/h is introduced into the metal layer by altering the stress inherent in each of the sub-layers $110_1$ to $110_n$ of the metal layer. That is, as formed, each sub-layer $110_x$ has a different level of inherent stress.

If sputter deposition is used to form the metal layer, different stress levels can be introduced into each sub-layer $110_x$ of the deposited metal layer 110 in a variety of ways, including adding a reactive gas to a plasma used during sputter deposition, depositing the metal at an angle, and changing the pressure of the plasma. In various embodiments, the different levels of stress are introduced into the metal layer 110 by varying the pressure of the plasma gas, which is preferably argon.

In various exemplary embodiments, the metal layer 110 is deposited in several sub-layers with different intrinsic stress, which results in the metal layer 110 having a stress gradient Δσ/h which is compressive in the lower portion of the metal layer 110 and becomes increasingly tensile toward the top of the metal layer 110. Although the stress gradient Δσ/h urges the metal layer 110 to bend into an arc, the metal layer 110 initially adheres to the insulating underlayer 230, the substrate 200 and/or the contact pad 240 and thus lies flat.

Figure 24:
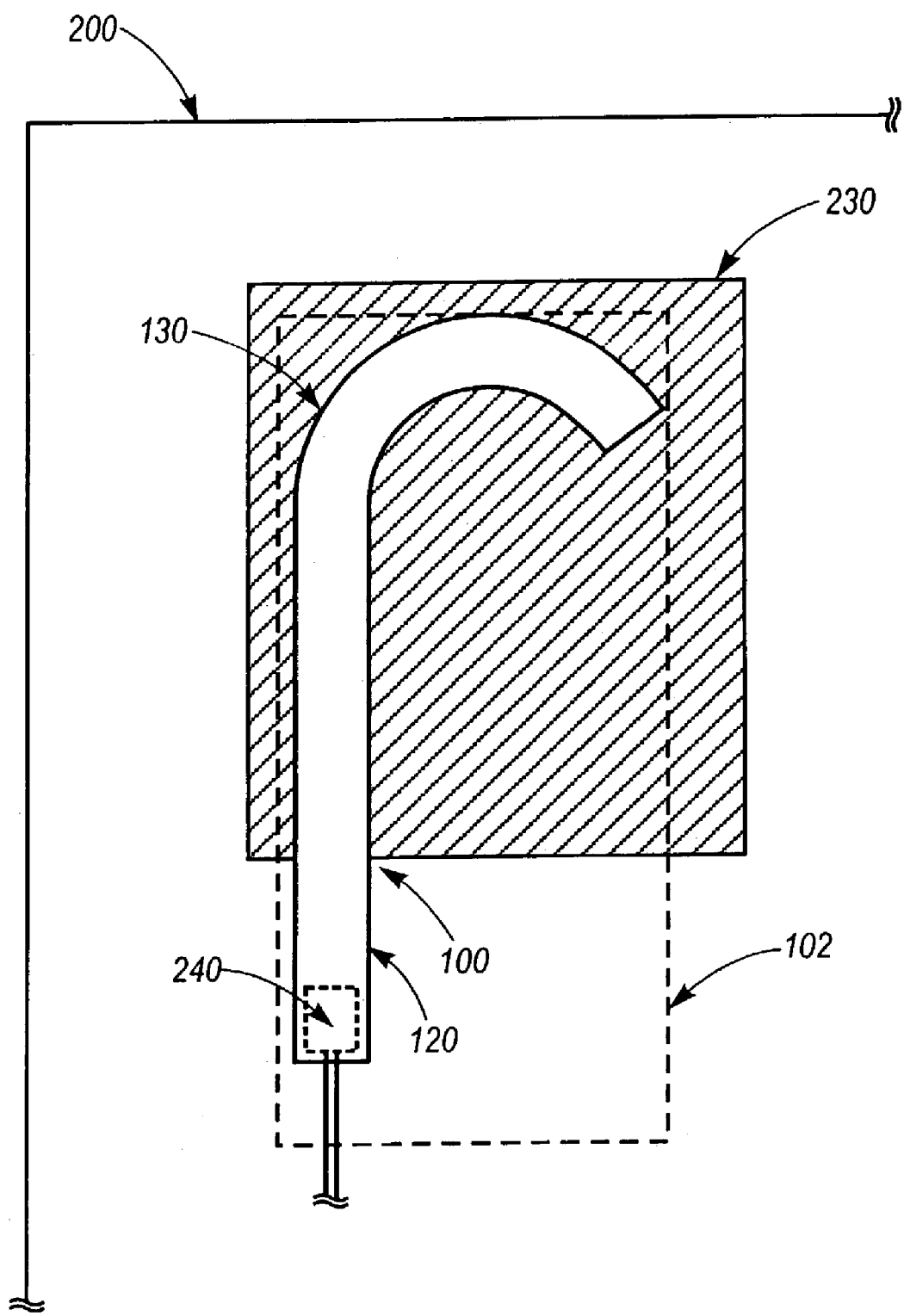
FIG. 24 is a top view of a second exemplary embodiment of an interconnect structure having multi-axis spring compliance according to this invention.

After the metal layer 110 is deposited, the metal layer 110 is photolithographically patterned to form the individual interconnect structures 100. Photolithographic patterning is a well-known technique and is routinely used in the semiconductor chip industry. As shown in FIG. 21, according to one technique, a positive photosensitive resist layer 250 is spun on top of the metal layer 110 and soft-baked at 90° C. to drive off solvents in the resist layer 250. The photosensitive resist layer 250 is exposed to an appropriate dose of ultra-violet light and then developed. Exposed areas of the resist layer 250 are removed during developing and the remaining resist layer 250 is hard-baked at 120° C. Wet or plasma etching is then used to remove the exposed areas of the metal layer 110. The areas of the metal layer 110 under the remaining portions of the resist layer 250 that remain after etching form the interconnect structure 100. FIG. 24 shows a top view of one exemplary embodiment of such an interconnect structure 100. The area of the metal layer 110 removed by etching is described by the dashed line 102.

Figure 22:
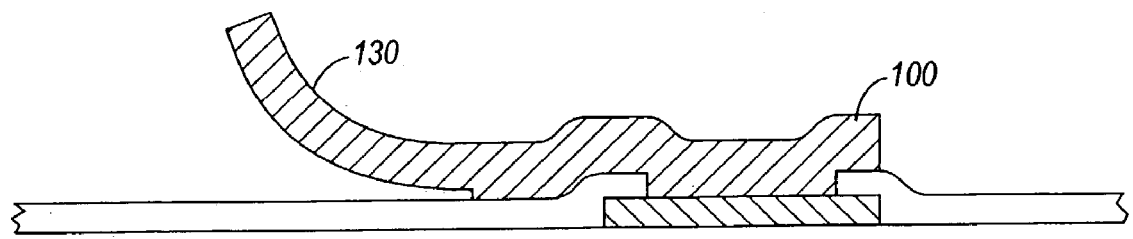

Next, as shown in FIG. 22, the released portion 130 of the interconnect structure 100 is released from the insulating underlayer 230 by under-cut etching. Until the released portion 130 is released from the insulating underlayer 230, the released portion 130 adheres to the insulating underlayer 230 and the interconnect structure 100 lies flat on the substrate 200. There are two methods for releasing the released portion of the interconnect structure 100 from the substrate 200 or insulating underlayer 230. In a first method, the insulating underlayer 230, typically silicon nitride, is deposited by plasma chemical vapor deposition (PECVD) at a temperature of 60–250° C. This gives the insulating underlayer 230 a fast etch rate. The insulating underlayer 230 is then pre-patterned, before the metal layer 110 is deposited, into islands on which the interconnect structure 100 will be formed.

After the interconnect structures 100 are formed on or over the islands of the insulating underlayer 230, the released portion 130 of the interconnect structures 100 are released from the islands of the insulating underlayer 230 by etching the islands with a selective etchant. The selective etchant is typically a HF solution. The etchant is called a selective etchant because it etches the insulating underlayer 230 faster than the selective etchant removes metal from the metal layer 110. This means that the released portions 130 of the interconnect structures 100 are released from the insulating underlayer 230 and are allowed to bend up and away from the insulating underlayer 230 due to the stress gradient Δσ/h in the interconnect structure 100. The islands of the insulating underlayer 230 can also be formed of a low-melting-temperature material, such as solder or plastic. In this technique, after the interconnect structure 100 is formed, the low-melting-temperature material is heated to release the released portion 130 of the interconnect structure 100.

In a second method for releasing the released portion 130 of the interconnect structure 100, the insulating underlayer 230, if used, is not pre-patterned into islands. Instead, after the interconnect structure 100 is formed, a passivation layer, such as silicon oxynitride, is deposited on the interconnect structure 100 and the surrounding areas by PECVD. The passivation layer is patterned into windows, such as the shaded area shown in FIG. 24, to expose the released portion 130 of the interconnect structure 100 and surrounding areas of the insulating underlayer 230. The same selective etchant, the HF solution, can be used to etch the insulating underlayer 230 and release the released portion 130 of the interconnect structure 100. This method avoids a step discontinuity in the material of the interconnect structure 100 at an edge of the anchor portion 120 and leaves an insulating cover on or over the anchor portion 120. The insulating cover protects the anchor portion 120 from short-circuiting and also helps hold the anchor portion 120 down on to the substrate 200.

Only those areas of the insulating underlayer 230 under the released portion 130 of the interconnect structure 100 are under-cut etched. The areas of insulating underlayer 230 under-cut etched for each interconnect structure 100 is described by the shaded portion in FIG. 24. This means that the anchor portions 120 of the interconnect structure 100 remain fixed to the insulating underlayer 230 and do not pull away from the insulating underlayer 230. It should be appreciated that in various exemplary embodiments the method for patterning the metal layer 110 into the interconnect structure 100 does not result in any annealing of the metal layer 110.

Additional steps can be added to the under-cut etching process to improve the process, if necessary. For example, etchant vias, or small windows, can be etched into the released portion 130 of the interconnect structure 100. The etchant vias provide faster access to the selective etchant to the insulating underlayer 230, speeding up the process of releasing the released portions 130 from the insulating underlayer 230. Also, a hard mask, made of, for example, silicon, can be applied to the top surface of the interconnect structure 100 to ensure that the etchant does not remove material from the top surface of the interconnect structure 100 in case the photosensitive material 250 protecting the top of the interconnect structure 100 fails during patterning of the interconnect structure 100.

Once the released portion 130 is freed from the insulating underlayer 230, the stress gradient $\Delta\sigma/h$ causes the released portion 130 to bend up and away from the substrate 200. The stress gradient $\Delta\sigma/h$ is still inherent in the anchor portion 120 and urges the anchor portion 120 to pull away from the substrate 200.

To decrease the chance that the anchor portion 120 will pull away from the substrate 200, the interconnect structure 100 can be annealed to relieve the stress in the anchor portion 120. This annealing process does not affect the released portion 130 because, once the released portion 130 is released and allowed to bend up, no stress remains on the released portion 130 to be relieved by annealing. Thus, the released portion 130 remains curved up and away from the substrate 200 after annealing.

Figure 23:
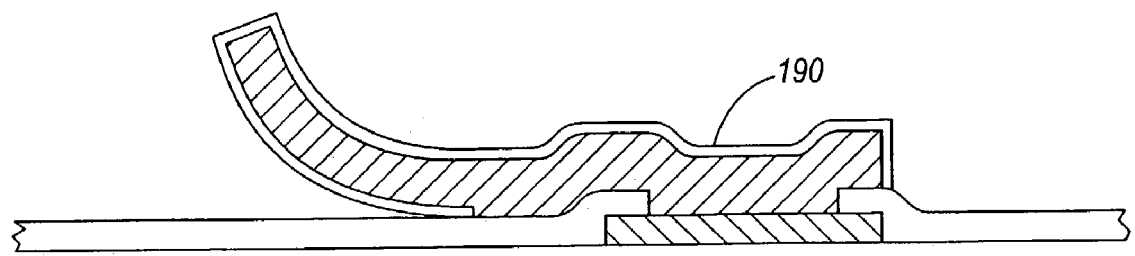

FIG. 23 shows a layer of gold 190 plated over the outer surface of the interconnect structure 100. The layer of gold 190 may be used to reduce the resistance in the interconnect structure 100, but any other conductive material can be used in place of gold. In various exemplary embodiments, the gold layer 190 is plated on the interconnect structures 100 using an electroless plating process.

Figure 25:
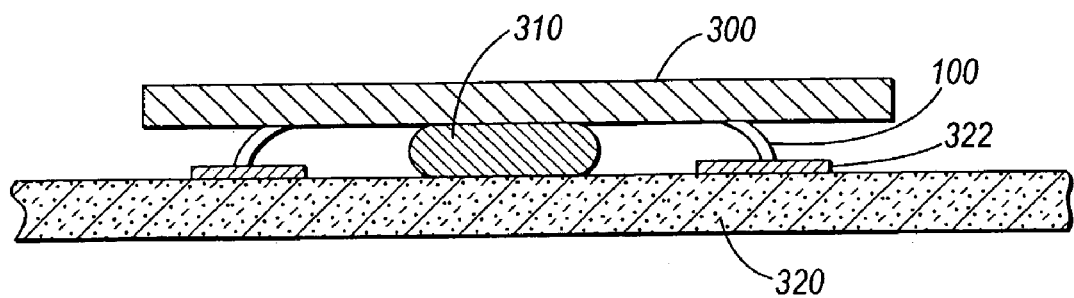
FIG. 25 shows a first exemplary embodiment of a chip electrically connected to a substrate using an interconnect structure having multi-axis spring compliance according to this invention.
Figure 26:
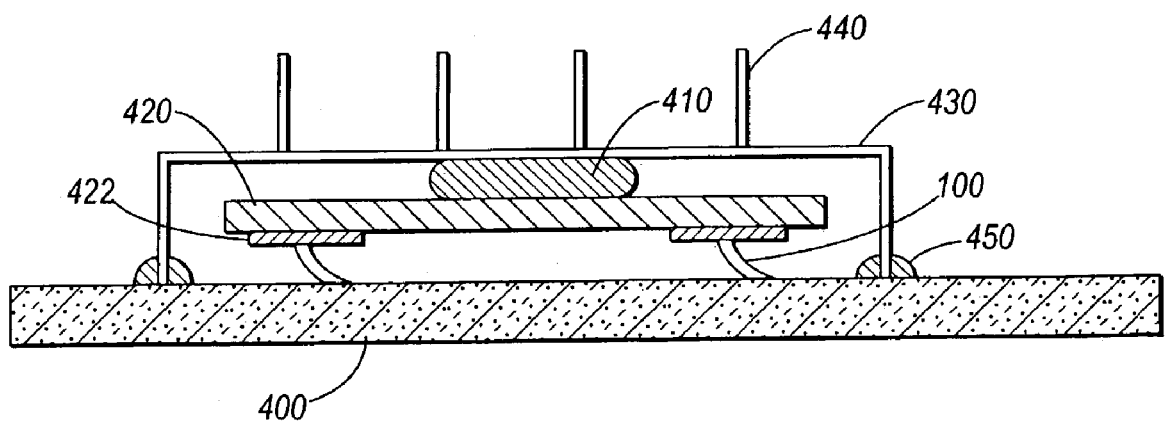
FIG. 26 shows a second exemplary embodiment of the chip electrically connected to the substrate using the interconnect structure having multi-axis spring compliance according to this invention.
Figure 27:
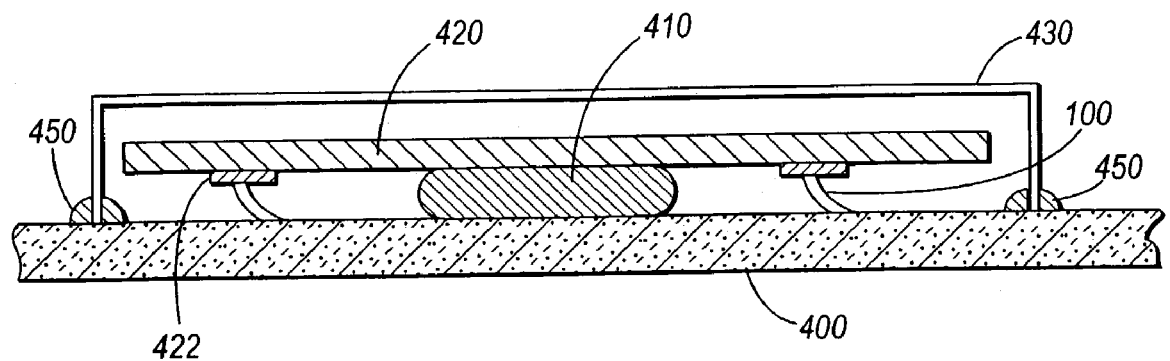
FIG. 27 shows a third exemplary embodiment of the chip electrically connected to the substrate by using the interconnect structure having multi-axis spring compliance according to this invention.

FIG. 25 shows a first exemplary embodiment of a chip 300 electrically connected to a substrate 320 using an interconnect structure 100 having multi-axis spring compliance according to this invention. As shown in FIG. 25, the interconnect structures 100 are formed on the lower surface of the chip 300. The interconnect structures 100 contact corresponding contact pads 322 on the substrate 320. The adhesive 310 holds the chip 300 stationary with respect to the substrate 320. As shown in FIG. 26, a substrate 400 has a plurality of interconnect structures 100 formed on a top surface of the substrate 400. The contact pads 422 formed on the lower surface of a chip 420 are electrically connected to the corresponding interconnect structures 100 on the substrate 400. The contact pads 422 formed on the lower surface of the chip 420 are thus electrically connected to the corresponding interconnect structures 100 on the substrate 400. A first adhesive 410 holds the chip 420 stationary relative to a dust cover 430 covering the chip 420 and a second adhesive 450 hermetically seals the dust cover 430 to the substrate 400. The dust cover 430 assures that moisture and other foreign substances do not corrode the interconnect structures 100 or the contact pads 422, or otherwise interfere with the electrical connections between the individual interconnect structures 100 and the corresponding contact pads 422. Optional cooling fins 440 and the dust cover 430 provide a heat sink to cool the chip 420. As shown in FIG. 27, in various other exemplary embodiments, the adhesive 420 holds the chip 420 stationary to the substrate 400. In the exemplary embodiment shown in FIG. 27, no heat sink function is provided by the dust cover 430.

Figure 28:
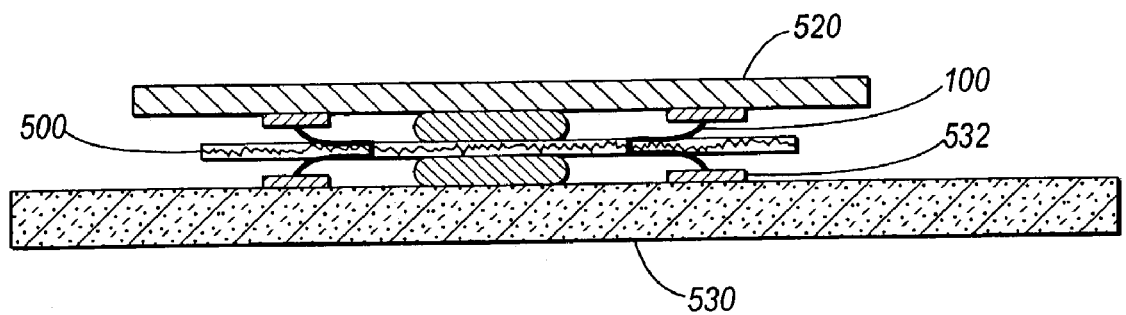
FIG. 28 shows one exemplary embodiment of an immediate wafer interconnect structure having multi-axis spring compliance according to this invention.

As shown in FIG. 28, in various other exemplary embodiments, a connecting device for electrically connecting two devices includes an intermediate wafer 500. The intermediate wafer 500 has a plurality of interconnect structures 100 formed on opposite sides of the wafer 500. Pairs of the interconnect structures 100 on opposite sides of the wafer 500 communicate with each other by way of vias etched in the intermediate wafer 520 and electrically connect the contact pads 522 and 532 on both a chip 520 and a second substrate 530. In these exemplary embodiments, the chip 520 and the second substrate 530 without risking damage to the interconnect structures 100. The wafer 500 is used to interconnect the chip 520 and the substrate 530 only after all processing is completed on the chip 520 and/or the second substrate 530.

The interconnect structures 100 are not limited to interconnecting the chip 520 to the second substrate 530, such as a circuit board. The interconnect structures 100 are equally well usable to interconnect two chips, two circuit boards, or any other two electronic devices to each other. Two exemplary applications are mounting driver chips to visual displays and assembling multi-chip modules (MCM's) for computers. Various other exemplary uses for the interconnect structures 100 are in probe cards. As discussed above, probe cards 7 (see FIG. 2) are used to temporarily connect two devices, typically when one of the devices is to be tested. Such testing is common in the semiconductor industry, where the probe cards 7 are used to test semiconductor chips while the chips are still part of a single-crystal silicon wafer.

Figure 29:
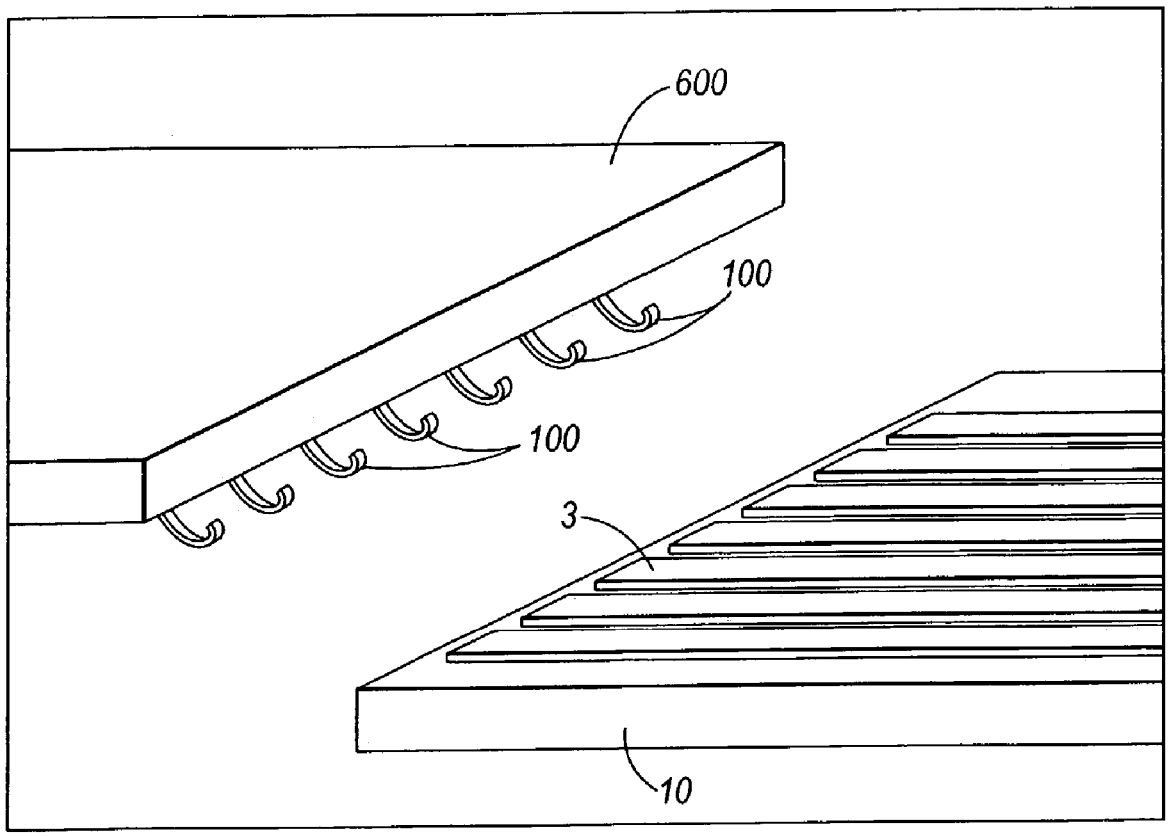
FIG. 29 shows a probe card having a plurality interconnect structure having multi-axis spring compliance according to the invention that is usable to test an electrical device.

FIG. 29 shows a probe card 600 that has an array of the interconnect structures 100 used in place of the standard probe needles 8 used in the probe card 7. The probe card 600 operates identically to the standard probe card 7, except for having the interconnect structures 100. The probe card 600 is aligned with the device 10 such that the interconnect structures 100 compliantly contact the corresponding contact pads 3 on the device 10. The device 10 is then tested or communicated with by a testing device electrically connected to the probe card 600.

Figure 30:
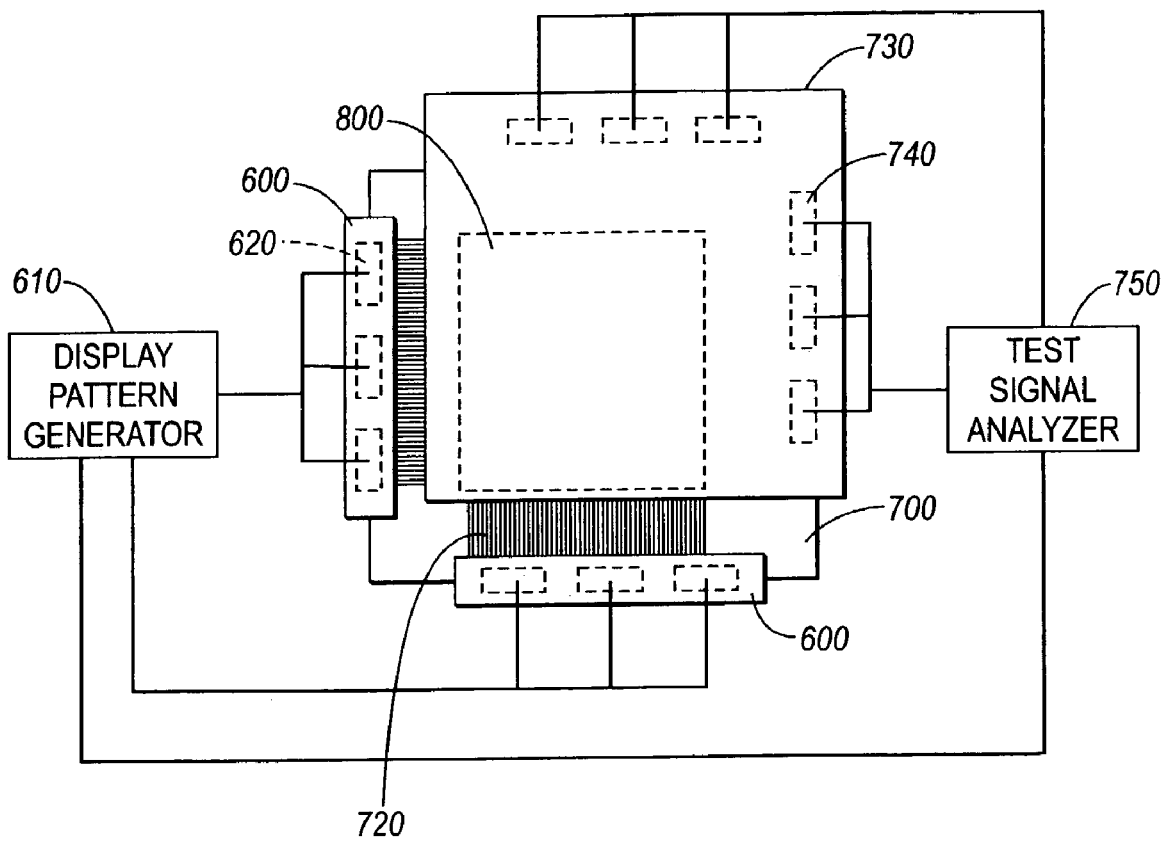
FIG. 30 shows a liquid crystal display and a device for testing the operation of the liquid crystal display.

FIG. 30 shows an examplary testing device. A display pattern generator 610 communicates with one or more driver chips 620 mounted on the two full-width probe cards 600. The probe cards 600 have the interconnect structures 100, which are used to contact associated lines 710 formed on a display plate 700. The addressing lines 720 communicate with display electrodes (not shown). Therefore, the display pattern generator 610 can drive the display electrodes to produce a matrix of electric potentials corresponding to a test image. Sensors (not shown) on the sensor plate 730 detect the matrix of electric potentials on the display electrodes and generate signals each corresponding to the electric potential. The signals are read out by scanner chips 740 mounted on the sensor plate 730. The test signal analyzer 750 receives the signals from the scanner chips 740 and forms a sensed image corresponding to the signals. The test signal analyzer 750 then compares the sensed image with the test image output by the display pattern generator 610 to determine if the display plate 700 and display electrodes are working properly.

Since producing a standard probe card 7 having probe needles 8 is labor intensive and time-consuming, standard probe cards 7 are not generally made to contact all of the addressing lines 720 on the display plate 700. Therefore, testing the display plate 700 must be done in sections, since the probe cards 7 cannot accommodate the full width of the addressing lines 720. In contrast, the probe card 600 that uses the interconnect structures 100 can be made easily and inexpensively. Also, the probe cards 600 that uses the interconnect structures 100 may be made to any width and therefore can test all of the data or address lines of an apparatus, such as the display shown in FIG. 30, at one time.

In various exemplary embodiments, wafer-scale testing and burning-in of the chips may be performed by a single probe card contacting all of the contact pads of all chips while the chips are still part of a single semiconductor wafer. The probe card may be a silicon wafer containing microcircuitry to distribute test signals to and from each chip on the wafer under test. The test signals can be distributed either all at once or sequentially to the chips.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of this invention.

What is claimed is:

1. A conductive spring interconnector for electrically joining circuit member, comprising:
   an anchor portion attached to a surface of a substrate;
   a free portion connected to the anchor portion and detached from the substrate, the free portion having a top surface;
   at least a first section of the free portion having at least one first bend, a curvature axis of the first bend substantially parallel to the top surface normal of the free portionl; and
   at least a second section of the free portion having at least one second bend, a curvature axis of the second bend substantially perpendicular to the top surface normal of the free portion, wherein the conductive spring has a compliance C including,
   a first compliance $C_x$, a second compliance $C_y$ and a third compliance $C_z$;
   the first compliance $C_x$ and the second compliance $C_y$ are in a plane that substantially parallels to the surface of the substrate;
   the first compliance $C_x$ is substantially parallel to a length of the conductive spring;
   the second compliance $C_y$ is substantially orthogonal to the length of the conductive spring; and
   the third compliance $C_z$ is substantially normal to the surface of the substrate.

2. The conductive spring of claim 1, wherein the compliance $C_x$ increases with an increase of a subtended angle parameter of the first bend.

3. The conductive spring of claim 1, wherein the compliance $C_y$ increases with an increase of a subtended angle parameter of the first bend.

4. The conductive spring of claim 3, wherein the compliance $C_y$ increases until the subtended angle parameter is about 90 degrees.

5. The conductive spring of claim 4, wherein the compliance $C_y$ decreases with further increase of the subtended angle parameter after about 90 degrees.

6. The conductive spring of claim 1, wherein the compliance $C_z$ increases with an increase of a subtended angle parameter of the first bend.

7. The conductive spring of claim 6, wherein the compliance $C_z$ increases until the subtended angle parameter is about 150 degrees.

8. The conductive spring of claim 6, wherein the compliance $C_z$ decreases with further increase of the subtended angle parameter after about 150 degrees.

9. The conductive spring of claim 1, wherein the compliance C reaches a maximum when a subtended angle parameter of the first bend is about 120 degrees.

10. The conductive spring of claim 1, wherein the compliance C increases with an increase in a radius parameter of the first bend.

11. The conductive spring of claim 1, wherein the compliance C increases with an increase in the length of the conductive spring.

12. The conductive spring of claim 1, wherein the compliance C of the conductive spring decreases with an increase in a width parameter of the conductive spring.

13. The conductive spring of claim 1, wherein the first bend has a clockwise bend.

14. The conductive spring of claim 1, wherein the first bend has an anti-clockwise bend.

15. The conductive spring of claim 1, wherein the first bend comprises at least one of clockwise and anti-clockwise bend.

16. The conductive spring of claim 1, wherein the first section and the second section occupy a same section of the conductive spring.

17. The conductive spring of claim 1, wherein the first section and the second section occupy different sections of the conductive spring.

18. The conductive spring of claim 1, wherein the conductive spring is metallic.

19. The conductive spring of claim 1, wherein the conductive spring is non-metallic.

20. The conductive spring of claim 1, wherein the conductive spring is plated with a material.

21. The conductive spring of claim 1, wherein the conductive spring is soldered to a contact pad on an opposing substrate.

22. An electronic apparatus including at least one conductive spring according to claim 1.

* * * * *